(12) United States Patent
Kim

(10) Patent No.: US 7,566,930 B2
(45) Date of Patent: Jul. 28, 2009

(54) NONVOLATILE MEMORY DEVICE AND METHOD FOR FABRICATING THE SAME

(75) Inventor: Heong Jin Kim, Gyeongbuk (KR)

(73) Assignee: Dongbu Electronics Co., Ltd., Seoul (KR)

( * ) Notice: Subject to any disclaimer, the term of this patent is extended or adjusted under 35 U.S.C. 154(b) by 106 days.

(21) Appl. No.: 11/646,804

(22) Filed: Dec. 27, 2006

(65) Prior Publication Data

US 2007/0152264 A1    Jul. 5, 2007

(30) Foreign Application Priority Data

Dec. 29, 2005    (KR) .................. 10-2005-0133784

(51) Int. Cl.
*H01L 29/788*    (2006.01)
(52) U.S. Cl. ............... 257/321; 257/330; 257/E29.304
(58) Field of Classification Search ............... 257/330
See application file for complete search history.

(56) References Cited

U.S. PATENT DOCUMENTS

| | | | |
|---|---|---|---|
| 4,964,080 A * | 10/1990 | Tzeng | 365/185.01 |
| 5,315,142 A * | 5/1994 | Acovic et al. | 257/316 |
| 5,739,567 A * | 4/1998 | Wong | 257/316 |
| 6,118,159 A * | 9/2000 | Willer et al. | 257/390 |
| 6,340,611 B1 * | 1/2002 | Shimizu et al. | 438/201 |
| 6,756,633 B2 * | 6/2004 | Wang et al. | 257/317 |
| 6,818,939 B1 * | 11/2004 | Hadizad | 257/302 |
| 6,917,069 B2 * | 7/2005 | Kianian et al. | 257/315 |

* cited by examiner

*Primary Examiner*—Sue Purvis
*Assistant Examiner*—Benjamin P Sandvik
(74) *Attorney, Agent, or Firm*—The Law Offices of Andrew D. Fortney; Andrew D. Fortney

(57) ABSTRACT

A nonvolatile (e.g., flash) memory device includes a substrate having a plurality of isolation areas and active areas; a trench formed on the isolation area; a first electrode layer formed on an inner wall of the trench; a first gate oxide layer formed between the inner wall of the trench and the first electrode layer; a junction area formed on the active area; a second gate oxide layer formed on the entire surface of the substrate including the first electrode layer, the first gate oxide layer, the trench and the junction area; a tunnel oxide layer formed on a part of the second gate oxide layer corresponding to the active area; and a second electrode layer formed on the active area and in the trench.

8 Claims, 4 Drawing Sheets

NONVOLATILE MEMORY DEVICE AND METHOD FOR FABRICATING THE SAME

BACKGROUND OF INVENTION

1. Field of Invention

The present invention relates to a semiconductor device. More particularly, the present invention relates to a nonvolatile (e.g., flash) memory device and a method for fabricating the same capable of improving the device characteristic.

2. Description of Related Art

Generally, an EEPROM device stores a bit or multi-bit using a single cell, and is a memory device capable of electrically programming and erasing data.

Meanwhile, among EEPROM devices, a FLOTOX type EEPROM uses hot electrons derived from the high voltage for the programming operation, and uses F-N (Fowler-Nordheim) tunneling for the erasing operation. Such an EEPROM device includes a floating gate electrode formed on upper part of a tunnel oxide layer, and a control gate electrode formed on the floating gate electrode to receive a predetermined voltage.

Such a conventional EEPROM device is classified into a single poly EEPROM and a double poly EEPROM according to a manufacturing process and the number of the used polysilicon layers.

Hereinafter, the method for fabricating the single poly EEPROM device will be explained with reference to accompanying drawings.

FIG.1 is a sectional view representing a conventional EEPROM device.

First, a substrate on which, the first type, for instance, a p type-well is defined is prepared.

Then, an isolation area 11 is formed by filling a predetermined area of the substrate with an insulating layer 17 through a LOCOS (Local Oxidation of Silicon) process or an STI (Shallow Trench Isolation) process.

Then, a junction area 12 is formed by implanting the second ions, for instance, n+ ions using a mask onto a predetermined area of an active area positioned between the isolation areas 11.

After that, the mask used in the ion implantation is removed, and the substrate 10 is heat-treated so that ions implanted onto the junction area 12 are activated.

Then, a gate insulating layer 13 is deposited on the substrate 10 including the junction area 12.

Then, a predetermined area of the gate insulating layer 13 is wet-etched so that the thickness of the gate insulating layer 13 is reduced. At this time, the oxide layer with the thickness partially reduced is called a tunnel oxide layer 14.

Then, polysilicon is deposited on the gate insulating layer 13 including the tunnel oxide layer 14, and is selectively removed, thereby forming a floating gate 15a. At this time, the floating gate 15a is formed so as to cover the tunnel oxide layer 14. An activated transistor gate 15b is formed simultaneously with the floating gate 15a through the etching process for forming the floating gate 15a.

Then, the second type, for instance, n type ions are implanted onto the floating gate 15a and the activated transistor gate 15b.

However, the method for fabricating the conventional EEPROM device uses an independently-buried junction area for an erase mechanism control, and the conventional EEPROM device should be made considerably in a large size to increase the voltage level coupled to the floating gate. Such a structure makes it difficult to reduce the size of the cell.

In addition, since the erase mechanism is performed only by a positive method, a high voltage is applied to the junction area in the programming and erasing operations, so that the junction area having a withstanding voltage against the voltage drop due to a leakage and a high BV (Breakdown Voltage) voltage is needed. This is inadvantageous when making the device with a size below a predetermined level.

BRIEF SUMMARY OF THE INVENTION

The present invention has been made to solve the above problem occurring in the prior art, and an object of the present invention is to provide a flash memory device and a method for fabricating the same, in which a part of an isolation layer is filled with polysilicon so as to use it as an acceleration line.

To achieve the above objects, the present invention provides a flash memory device comprising: a substrate having a plurality of isolation areas and active areas; a trench formed in the isolation area; a first electrode layer formed on an inner wall of the trench; a first gate oxide layer formed between the inner wall of the trench and the first electrode layer; a junction area formed on the active area; a second gate oxide layer formed on an entire surface of the substrate including the first electrode layer, the first gate oxide layer, the trench, and the junction area; a tunnel oxide layer formed on a part of the second gate oxide layer corresponding to the active area; and a second electrode layer formed on the active area and in the trench.

Here, a thickness of a part of the second electrode layer corresponding to the trench is thicker than a thickness of remaining parts of the second electrode layer.

To achieve the above objects, the present invention provides a method for manufacturing a flash memory, the method comprising the steps of: preparing a substrate having a plurality of isolation areas and active areas; forming a trench at least in one of the isolation areas; forming a photoresist pattern so as to cover an entire surface of the substrate except for the trench; sequentially forming a first gate oxide layer, and a first electrode layer on the entire surface of the substrate including the photoresist pattern and on an inner wall of the trench; forming a protective material layer on the entire surface of the substrate so as to fill the trench; performing a planarization process on the first gate oxide layer, the first electrode layer and the protective material layer, until the photoresist pattern is exposed; reducing a thickness of the first gate oxide layer, the first electrode layer and the protection material layer through an etching process; forming a spacer at both sides of the photoresist pattern so as to cover the first gate oxide and the first electrode layer; removing the exposed protective material by using the spacer as a mask; removing the photoresist pattern and the spacer; forming a junction area in the active area; forming a second gate oxide layer on the active area; removing a part of the second gate oxide layer positioned on the junction area so that a part of the junction area is exposed; forming a tunnel oxide layer on the junction area exposed; and forming a second electrode layer on the active area and in the trench.

Here, the second electrode layer formed corresponding to the trench has a thickness thicker than that of remaining parts of the second electrode layer.

According to still yet another aspect of the present invention, there is provided a method for manufacturing a flash memory device, the method comprising a first of preparing a substrate having an isolation area and an active area; a second of forming a trench on a isolation area; a third of sequentially forming a first gate oxide layer and a first electrode layer on an inner wall of the trench; a fourth of forming a junction area by implanting dopants onto the active area; a fifth of forming a second gate oxide layer on an entire surface of the substrate;

a sixth of exposing a part of the junction area by partially removing the second gate oxide on the junction area; a seventh of forming a tunnel oxide layer on the junction area exposed; an eighth of forming a second electrode layer on the active area and in the trench.

According to another embodiment of the present invention, the second gate oxide layer is also formed on the first electrode in the trench.

According to still another embodiment of the present invention, the tunnel oxide layer has a thickness thinner than a thickness of the second gate oxide layer.

According to still yet another embodiment of the present invention, the junction area is positioned adjacent to the isolation area.

DETAILED DESCRIPTION OF THE INVENTION

Hereinafter, a flash memory device according to an exemplary embodiment of the present invention will be explained in detail with reference to accompanying drawings.

Figure 1:
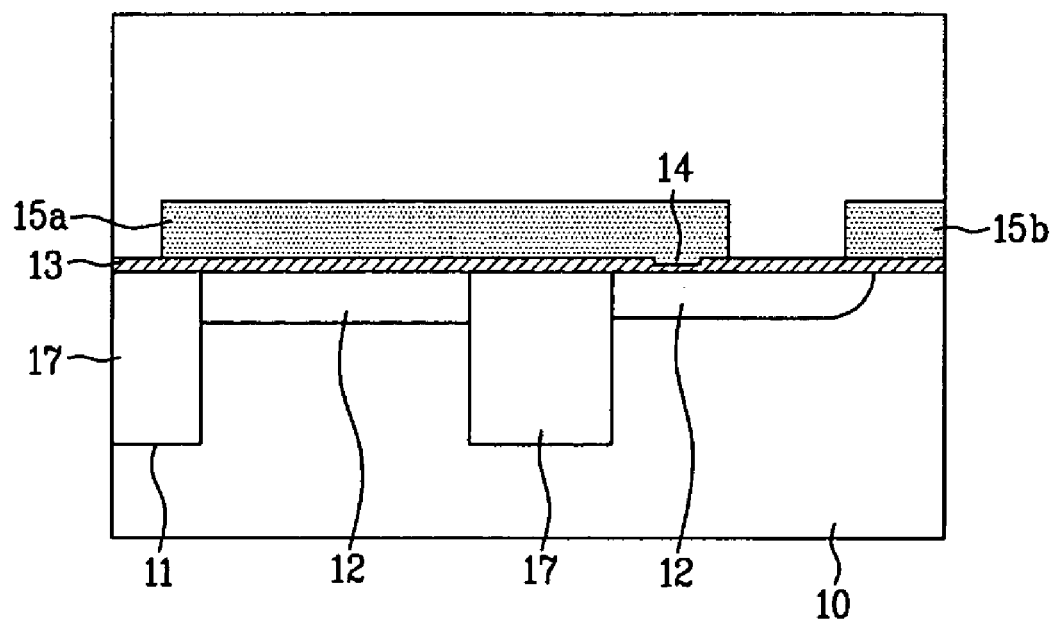
FIG. 1 is a view representing a flash memory device according to the related art.
Figure 2:
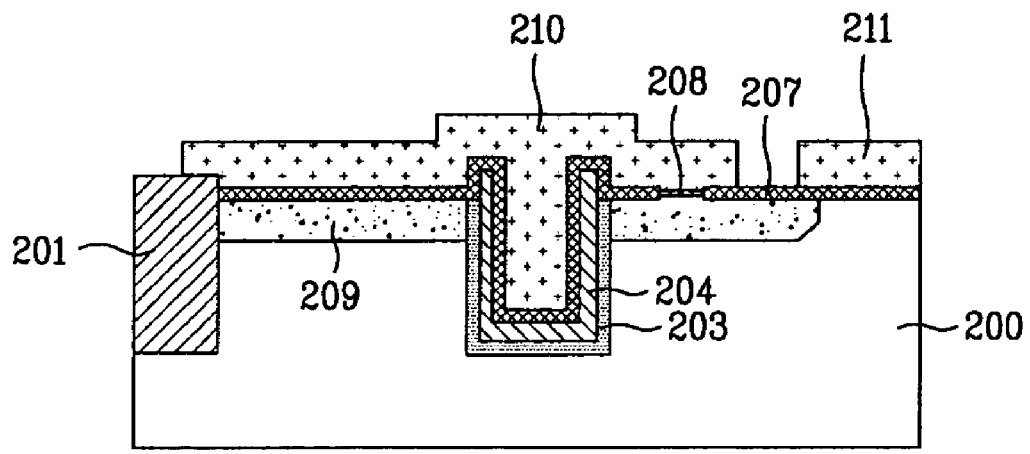
FIG. 2 is a view representing a flash memory device according to an exemplary embodiment of the present invention.

FIG. 2. is a view representing a flash memory device according to an exemplary embodiment of the present invention.

A flash memory device according to an exemplary embodiment of the present invention, as illustrated in FIG. 2, includes a substrate 200 having a plurality of isolation areas and active areas, a trench 402 formed in a predetermined isolation area, a first electrode layer 204 formed on the inner wall of the trench 402, a first gate oxide layer 203 formed between the inner wall of the trench 402 and the first electrode layer 204, a junction area 209 formed on the active area, a second gate oxide layer 207 formed on the entire surface of the substrate 200 including the first electrode layer 204, the first gate oxide layer 203, the trench 402 and the junction area 209, a tunnel oxide layer 208 formed on a part of the second gate oxide layer 207 corresponding to the active area and a second electrode layer 210, 211 formed on the active area and in the trench 402.

In this case, the thickness of the second electrode layer 210 on the trench 402 is thicker than the thickness of the rest of the second electrode layer 211.

A method for fabricating the flash memory device having such a structure according to an exemplary embodiment of the present invention will be explained below.

Figure 3A:
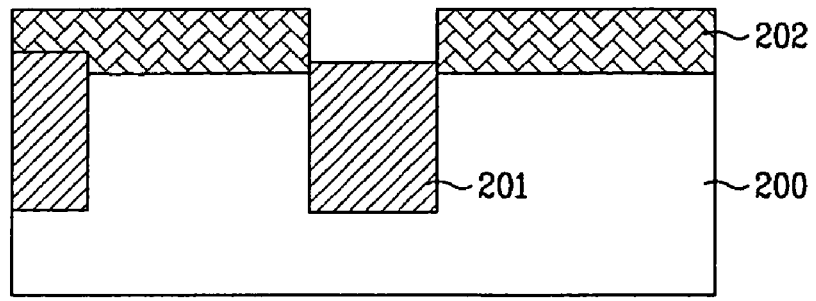
FIGS. 3a to 3h are views representing the method for fabricating the flash memory device according to an exemplary embodiment of the present invention.

First, as illustrated in FIG. 3a, a substrate 200 having a plurality of active areas and isolation areas is prepared. Then, a first type, for instance, p type well is formed on the substrate 200.

After that, an isolation layer 201 is formed on the isolation area. Then, a photoresist is formed on the entire surface of the substrate 200 including the isolation layer 201, and a photoresist pattern is formed by a photo process and a development process.

The photoresist pattern is formed on the surface so as to expose one of the isolation layers 201.

Figure 3B:
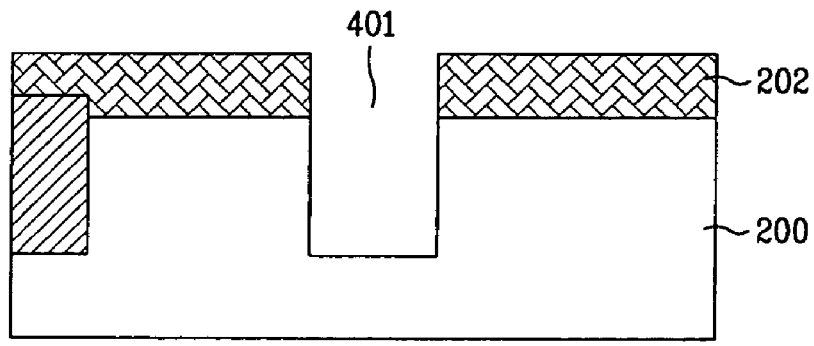

Then, as illustrated in FIG. 3b, the trench 402 is formed by removing the isolation layer 201 exposed through the photoresist pattern 202 serving as a mask.

Figure 3C:
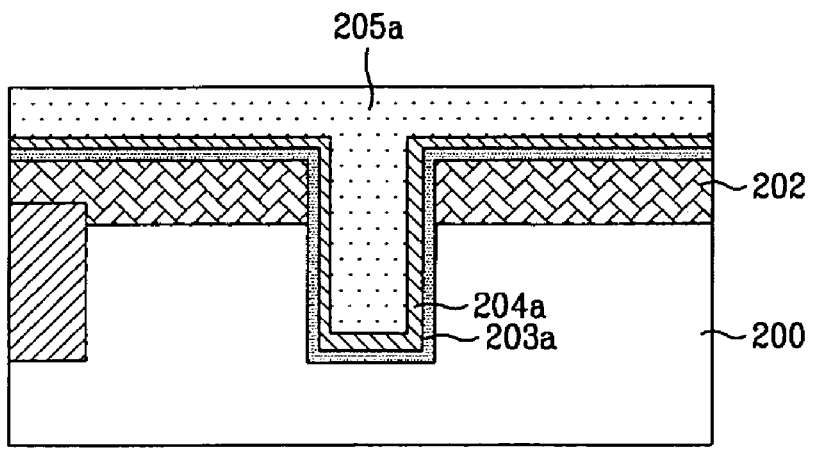

Then, as illustrated in FIG. 3c, a first oxide layer 203a, a first electrode layer material 204a and a protective material 205a are sequentially deposited on the entire surface of the substrate 200 to fill the trench 402.

Then, the first oxide layer 203a, the first electrode material 204a and the protective material 205a are polished by a CMP (Chemical Mechanical Polishing) process until the surface of the photoresist pattern 202 is exposed.

Figure 3D:
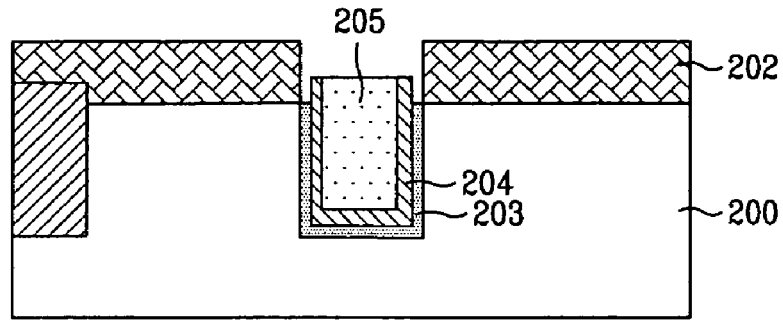

Then, as illustrated in FIG. 3d, a first gate oxide layer 203, a first electrode layer 204 and a protective layer 205 are formed by partially etching the first oxide layer 203a exposed through the photoresist pattern 202 serving as a mask, the first electrode material 204a and the protective material 205a.

In this case, the etched depth of the first gate oxide layer 203 is deeper than the etched depth of the first electrode layer 204 and the protective layer 205.

Figure 3E:
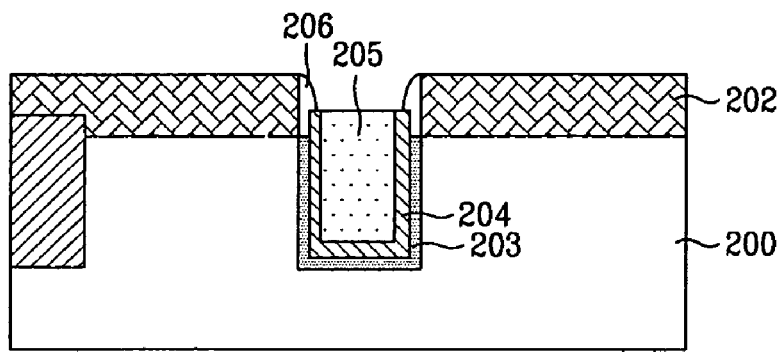

Then, as illustrated in FIG. 3e, an insulating layer is formed on the entire surface of the substrate 200 and is etched without a mask so that a spacer 206 is formed at both sides of the photoresist pattern 202.

In this case, the spacer 206 is formed so as to cover the first gate oxide layer 203 and the first electrode layer 204.

Figure 3F:
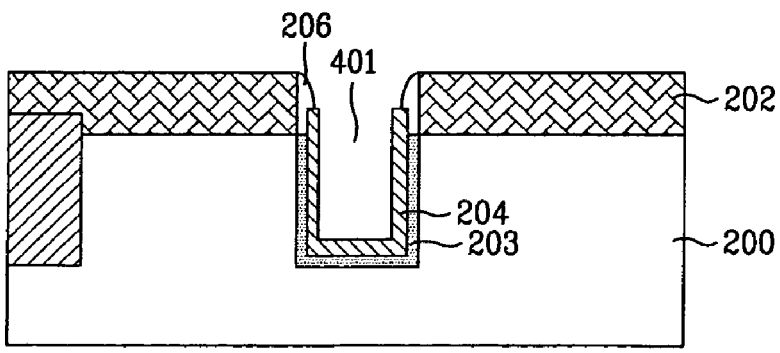

Then, as illustrated in FIG. 3f, the protective layer 205 is etched away by using a spacer 206 as a mask.

Figure 3G:
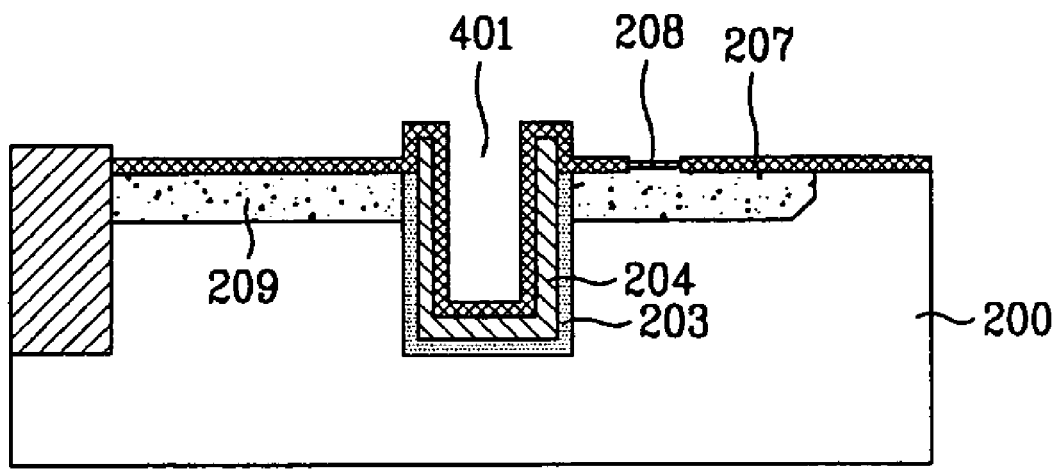

Then, as illustrated in FIG. 3g, after the spacer 206 and the photoresist pattern 202 are removed, the junction area 209 is formed by implanting dopants onto the active area.

After that, a second oxide layer is deposited on the entire surface of the substrate 200 in which the junction area 209 is formed. Then, the second oxide layer is pattered by a photo process and a development process so that the second gate oxide layer 207 is formed on the active area and the first electrode layer 204.

Then, a part of the second gate oxide layer 207 positioned on the junction area 209 is removed so that a part of the junction area 209 is exposed. Then, the tunnel oxide layer 208 is formed on the junction area 209 exposed.

In this case, the tunnel oxide layer 208 has a thickness thinner than a thickness of the second gate oxide layer 207.

Figure 3H:
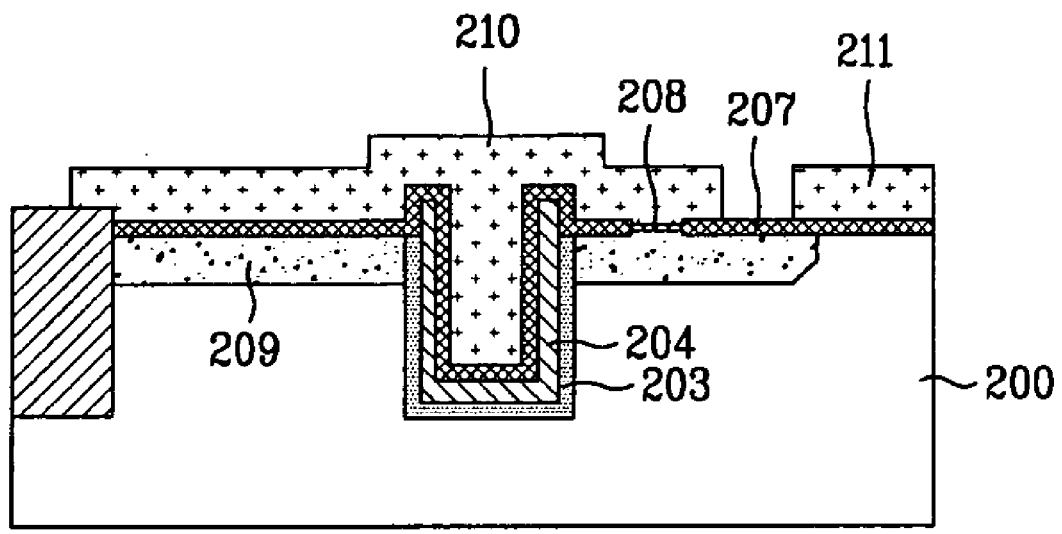

Then, as illustrated in FIG. 3h, a second electrode material is deposited on the entire surface of the substrate 200. Then, a photo process and a development process are performed on the second electrode material so that the second electrode layer 210, 211 is formed in the trench 402 and on the active area.

The second electrode layer 210 overlapped with the first electrode layer 204 functions as a floating gate, and the rest of the second electrode layer 211 functions as an access gate. In this case, the floating gate 210 is formed so as to cover the tunnel oxide layer 208.

Whereas, the second electrode layer 210, 211 has a height higher on the trench 402 than a height on the junction area 209.

In this case, the first electrode layer 204 and the second electrode layer 210, 211 preferably include polysilicon.

The flash memory device according to the present invention is operated as below.

In FIG.2, the floating gate 210 and a predetermined area of the lower part of the floating gate 210 function as a sense transistor. The access gate 211 spaced apart from the floating gate 210 and the junction area 209 of the lower part of the access gate 211 may function as an access transistor.

In the erasing operation, the floating gate voltage (Vfg) is determined by the capacitance between the junction area 209 and the floating gate 210 overlapped with the junction area 209 to the capacitance between all of the thing overlapped with the floating gate 210 ratio.

In the programming operation, the access transistor is turned on so as to apply the voltage to a source, electrons or holes charged in the source junction area 209 by the voltage difference between the floating gate voltage formed on the floating gate 210 in the erasing operation and the voltage applied to the source junction area 209 can be ejected or injected, so that the threshold voltage (Vth) has a negative value, thereby representing the state of 'ON'.

In this case, when a negative voltage is applied to the first electrode layer 204 functioning as the control gate so that the program threshold voltage (Pgm Vt) can be further reduced.

The flash memory device in which a part of the isolation area is filled with the polysilicon so as to use as an acceleration line in the erasing or the programming operations thereby easily controlling a coupling voltage.

Although the conventional EEPROM has an erase line only having active areas, in the EEPROM according to the present invention, the part of the isolation areas filled with polysilicon electrically works in the erasing operation as well as in the programming operation so that the size of a cell can be reduced while having a line width identical to a line width of the conventional EEPROM.

In addition, since a predetermined isolation area is filled with polysilicon, self-align is possible so that an unnecessary exposure process is omitted, thereby reducing the margin incurred in the exposure process.

In addition, in the present invention, polysilicon filled in the isolation area serves as an acceleration line so that the positive or the negative voltage is easily applied thereby reducing the junction area 209.

As explained above, the flash memory device and the method for fabricating the same has a following advantage.

First, although a high voltage is applied to the control gate defined by filling the isolation area with polysilicon in the erasing operation, a leakage path is not formed.

Second, a part of the isolation areas is filled with polysilicon and serves as a kind of electrode, thereby contributing to the definition of the floating gate voltage Vfg and obtaining a high coupling ratio.

Third, the present invention makes use of the negative voltage in the erasing operation, although only the positive voltage is used in the erasing operation in the related art.

Fourth, the low voltage applied in the erasing operation makes it possible to perform a thermal process of a low temperature, when the junction area is annealed, Fifth, although the isolation area and the active area are independently defined in the conventional cell structure, according to the present invention, a part of the isolation area in the cell area is filled with an electrode material in the erasing operation and the programming operation, so that a BN line width of the erase line is reduced.

Sixth, in the programming operation, the negative voltage is applied to the electrode material filled in the isolation area, so that the voltage level of the access transistor is reduced, as compared with the related art.

Seventh, the depth of the drain and source junction area of the access transistor can be reduced.

Eighth, a low voltage can be applied so that the channel length of the transistor can be reduced.

It will be apparent to those skilled in the art that various modifications and variations can be made in the present invention. Thus, it is intended that the present invention covers the modifications and variations thereof within the scope of the appended claims.

What is claimed is:

1. A nonvolatile memory device, comprising:
   a substrate having a plurality of isolation areas and active areas;
   a first trench in at least one of the isolation areas;
   a first gate oxide layer in the first trench;
   a control gate on the first gate oxide layer;
   a junction area in at least one of the active areas;
   a second gate oxide on a surface of the substrate including the control gate, the first gate oxide layer, and the junction area;
   a tunnel oxide in a part of the second gate oxide layer in the active areas; and
   a floating gate formed over the control gate, second oxide layer and tunnel oxide.

2. The nonvolatile memory device of claim 1, wherein the first gate oxide layer has uniform thickness in the trench.

3. The nonvolatile memory device of claim 1, wherein the control gate is in contact with the first gate oxide layer and the second gate oxide layer.

4. The nonvolatile memory device of claim 1, wherein the control gate is formed across an entire bottom surface and along entire side surfaces of the first trench on the first gate oxide layer.

5. The nonvolatile memory device of claim 1, wherein the tunnel oxide has a thickness less than that of the second gate oxide layer in the active area.

6. The nonvolatile memory device of claim 1, wherein the junction area comprises a source on a first side of the first trench and a drain on an opposite side of the first trench.

7. The nonvolatile memory device of claim 1, further comprising an access gate in a part of one of the active areas not occupied by the floating gate.

8. The nonvolatile memory device of claim 7, wherein the access gate comprises a same material and has a same thickness as the floating gate in the one active area outside the first trench.

* * * * *